United States Patent
Yamamoto et al.

(10) Patent No.: US 6,744,667 B2
(45) Date of Patent: Jun. 1, 2004

(54) BIT LINE CONTROL DECODER CIRCUIT, VIRTUAL GROUND TYPE NONVOLATILE SEMICONDUCTOR STORAGE DEVICE PROVIDED WITH THE DECODER CIRCUIT, AND DATA READ METHOD OF VIRTUAL GROUND TYPE NONVOLATILE SEMICONDUCTOR STORAGE DEVICE

(75) Inventors: Kaoru Yamamoto, Yamatokoriyama (JP); Nobuhiko Ito, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 12 days.

(21) Appl. No.: 10/256,255

(22) Filed: Sep. 27, 2002

(65) Prior Publication Data

US 2003/0058712 A1 Mar. 27, 2003

(30) Foreign Application Priority Data

Sep. 27, 2001 (JP) ........................................ 2001-296435

(51) Int. Cl.[7] .............................................. G11C 16/04
(52) U.S. Cl. .............................. 365/185.16; 365/185.11; 365/185.18
(58) Field of Search ....................... 365/185.11, 185.16, 365/185.18

(56) References Cited

U.S. PATENT DOCUMENTS

| | | | | |
|---|---|---|---|---|
| 4,992,980 A | * | 2/1991 | Park et al. | 365/185.16 |
| 5,027,321 A | | 6/1991 | Park | 365/185.16 |
| 5,592,000 A | * | 1/1997 | Onishi et al. | 257/315 |
| 5,959,892 A | * | 9/1999 | Lin et al. | 365/185.28 |
| 6,088,265 A | * | 7/2000 | Ohta | 365/185.16 |
| 6,134,142 A | * | 10/2000 | Hirano | 365/185.09 |

FOREIGN PATENT DOCUMENTS

| | | |
|---|---|---|
| JP | 3176895 | 6/1991 |
| JP | 6068683 | 3/1994 |

* cited by examiner

*Primary Examiner*—Son Mai
(74) *Attorney, Agent, or Firm*—Morrison & Foerster LLP

(57) ABSTRACT

There is provided a virtual ground type nonvolatile semiconductor storage device capable of effectively suppressing a leak current to the adjacent cell and thereby achieving high-speed read. During read operation, a ground potential GND is applied to a bit line SBL5 connected to the source region of one memory cell transistor MC04 subjected to read. Moreover, a read drain bias potential Vread is applied to a bit line SBL4 connected to the drain region of the memory cell transistor MC04. A bit line SBL3 connected to the drain region of a first adjacent memory cell transistor MC03 is put into a floating state. A potential Vdb equal to the read drain bias potential Vread is applied to a bit line SBL2 connected to the drain region of a second adjacent memory cell transistor MC02.

11 Claims, 11 Drawing Sheets

READ, VERIFY

WRITE

ERASE

BIT LINE CONTROL DECODER CIRCUIT, VIRTUAL GROUND TYPE NONVOLATILE SEMICONDUCTOR STORAGE DEVICE PROVIDED WITH THE DECODER CIRCUIT, AND DATA READ METHOD OF VIRTUAL GROUND TYPE NONVOLATILE SEMICONDUCTOR STORAGE DEVICE

BACKGROUND OF THE INVENTION

The present invention relates to a bit line control decoder circuit, a virtual ground type nonvolatile semiconductor storage device provided with the decoder circuit, and a data read method of the virtual ground type nonvolatile semiconductor storage device.

In recent years, flash memory capacity is being increased according to the functional development of portable telephones and the expansion of uses on the market of memory cards and files, and devices of small effective cell areas, such as a multi-valued system and a virtual ground array system have successively been developed in order to cope with cost reduction. In particular, the virtual ground array system, which can achieve a small cell area by devising a circuit thereof, permits the development of a device of a small chip area through the same processes. However, because of the virtual ground structure, there cannot be ignored a leak current (properly referred to generically as a "leak current to the adjacent cell") from the memory cell subjected to read (this is referred to as a "read cell") to the cell (this is referred to as an "adjacent cell") located adjacent to the cell or from the adjacent cell to the read cell, and various devices are needed to achieve high-speed read.

In order to improve the aforementioned problem, Japanese Patent Laid-Open Publication Nos. HEI 3-176895 and HEI 6-68683 propose virtual ground array read methods.

FIG. 10 shows the construction of the virtual ground type memory array of an EPROM disclosed in Japanese Patent Laid-Open Publication No. HEI 3-176895. A memory cell 10 is constructed of the well-known electrically programmable insulated gate n-channel field-effect transistor. Each memory cell 10 has a control gate connected to a row line 15, a source region connected to a source column line 12 and a corresponding drain region connected to a drain column line 13. In this figure, the source column line 12 and the drain column line 13 are buried bit lines formed of a diffusion region.

When a memory cell 10b is selected from this memory array to read the contents, the selection is performed by boosting a row line 15a to a positive high potential and concurrently grounding a source column line 12b via a transistor 18. The other drain column lines 13b and so on located on the right-hand side of the source column line 12b remain floating. A read drain bias potential (DRB) supplied to a circuit point 19 is applied via a transistor 17 to a drain column line 13a. A drain bias voltage (RDP) supplied to a circuit point 22 is applied via a transistor 20 to a source column line 12a connected to an adjacent cell 10a. The other source column lines 12 and so on located on the left-hand side of the source column line 12a remain floating.

The value of the read drain bias potential RDP supplied to the circuit point 22 is equal to the potential DRB supplied to the circuit point 19, both being, for example, 1.2 [V]. By supplying the same voltage, a read current wholly flows through the read cell 10b without branching into the adjacent cell 10a. By thus preventing the leak current to the adjacent cell, high-speed access is achieved.

FIG. 11 shows the construction of a virtual ground type memory array disclosed in Japanese Patent Laid-Open Publication No. HEI 6-68683. In this memory array, diffusion wiring lines 1 through 9 operate as diffusion virtual ground lines and diffusion bit lines arranged alternately. The gate wiring lines 10, 11, 12, 13, 20 and so on are formed in a direction perpendicular to the diffusion wiring lines 1 through 9. A metal bit line 30 is provided every two diffusion bit lines, and bit line selecting NMOS transistors 103 and 104 are provided for the connection of the lines. Moreover, one metal virtual ground line is provided every two adjoining diffusion virtual ground lines, and diffusion virtual ground line selecting transistors 51, 52, 53, 61, 62 and 63 are provided for the connection of the lines. In addition, precharge select circuits 70 and 71 are provided.

When a memory cell 101 is selected from this memory array to read the contents, the diffusion virtual ground line select line 12 and the diffusion bit line select line 10 are first pulled up to Vcc simultaneously with the word line, and the diffusion virtual ground line select line 13 and the diffusion bit line select line 11 are made to have the ground level. At this time, only the metal virtual ground line 201 is pulled down to the ground level, and all the other metal virtual ground lines are made to have a precharge level Vpc. Consequently, the diffusion virtual ground lines 6 and 7 come to have the ground level, and the other diffusion virtual ground lines 5, 8 and 9 come to have the Vpc level. Moreover, with regard to the metal bit lines, a metal bit line 302 is selected by a Y-gate 24. Then, a select signal BSR of the diffusion bit line select line 10 is set at the Vcc level, and a select signal BSL of the diffusion bit line select line 11 is set at the ground level, therefore bringing about a state in which the diffusion bit line 3 is selected. Consequently, the diffusion virtual ground line 8 of the adjacent cell 102 is precharged with Vpc. In the above-mentioned manner, the leak current from the diffusion bit line 3 of the read cell to the adjacent cell 102 is suppressed.

In order to further increase the integration density, the virtual ground type memory array is constructed so that an identical diffusion bit line of one block is connected to the largest possible amount of memory cells. Moreover, in order to increase the capacity of the block select transistor to increase the reading speed, there is adopted a method for connecting the diffusion bit lines to the select transistors alternately into different directions every bit line for the provision of transistors of the largest possible size. In the above-mentioned array construction, the diffusion bit line resistance largely varies depending on the location in the array, and the drain voltage during read also causes a voltage drop depending on the location in the array.

FIG. 6 shows an example in which the drain of the read cell is located farthest from the block select transistor. Assuming that a memory cell MCn4 enclosed by a circle is the read cell, then a voltage Vread is applied to a bit line MBL4 connected to the drain. Moreover, a voltage Vdb equal to Vread is applied to a bit line MBL3 connected to the drain of an adjacent cell MCn3 in order to prevent the leak current. In this case, the read cell MCn4 is located farthest from the block select transistor TB4, and therefore, the bit line voltage Vread causes a voltage drop due to a bit line resistance Rd. However, the adjacent cell MCn3 is located nearest to the block select transistor TB3, and therefore, the bit line voltage Vdb is supplied to the drain of the adjacent cell MCn3 without causing a voltage drop. As a result, there is substantially achieved a relation of Vdb>Vread. Therefore, current inflow from the bit line of the adjacent cell MCn3 occurs when the adjacent cell MCn3 is in the ON-state, causing a current reduction at the read node. In the worst case, even when the read cell MCn4 is in the ON-state, there occurs misread that the cell is determined to be in the OFF-state.

As described above, in the conventional system, a voltage difference still occurs between the drain voltage of the read cell and the drain voltage of the adjacent cell, as a consequence of which a leak current flows into the read node depending on the state of the adjacent cell or a current flows from the read node to the adjacent cell. This possibly causes misread. Moreover, there is a problem that high-speed read is prevented by the leak current toward the adjacent cell even before the occurrence of misread.

SUMMARY OF THE INVENTION

Accordingly, it is an object of this invention to provide a virtual ground type nonvolatile semiconductor storage device capable of effectively suppressing the leak current to the adjacent cell and thereby achieving high-speed read and a data read method for the virtual ground type nonvolatile semiconductor storage device.

Another object of this invention is to provide a bit line control decoder circuit appropriate for the virtual ground type nonvolatile semiconductor storage device described above.

In order to achieve the aforementioned objects, according to one aspect of this invention, there is provided a virtual ground type nonvolatile semiconductor storage device, which has a plurality of nonvolatile memory cell transistors arranged in a matrix form, a plurality of word lines for performing row selection and a plurality of bit lines for performing column selection and in which a source region and a drain region of one memory cell transistor are formed in common with a drain region of a memory cell transistor located adjacently on one side in a direction of row and a source region of a memory cell transistor located adjacently on the other side in the direction of row, respectively, and the source and drain regions formed in common, are connected to the bit lines, the virtual ground type nonvolatile semiconductor storage device comprising:

means for applying a ground potential to the bit line connected to the source region of one memory cell transistor to be subjected to read during read;

means for applying a read drain bias potential to the bit line connected to the drain region of the one memory cell transistor;

means for putting the bit line connected to a drain region of a first adjacent memory cell transistor located adjacently on the other side in the direction of row of the one memory cell transistor into a floating state; and means for applying a potential equal to the read drain bias potential to the bit line connected to a drain region of a second adjacent memory cell transistor located adjacently on the other side in the direction of row of the first adjacent memory cell transistor.

In the virtual ground type nonvolatile semiconductor storage device of this invention, the potential equal to the read drain bias potential is applied to the bit line connected to the drain region of the second adjacent memory cell transistor during the read operation. The bit line connected to the drain region of the first adjacent memory cell transistor is in the floating state, and therefore, the drain region of the first adjacent memory cell transistor is precharged with the potential equal to the read drain bias potential. Therefore, the leak current from the drain node of the read cell to the adjacent cell is effectively suppressed.

Moreover, lately for the achievement of a high integration density, it is a frequent practice to constitute a block of a plurality of memory cells connected to the bit line (constructed of a diffusion region), interposingly providing a block select transistor at the end portion of each bit line alternately in the direction of row and apply a potential via the block select transistor. In this case, the read cell and the second adjacent memory cell transistor (this being properly referred to as a "second adjacent cell") are supplied with the potential from the same side in the direction of column. Therefore, the bit line resistance of the read cell and the bit line resistance of the second adjacent cell are substantially the same regardless of the location of the read cell in the array. Therefore, according to the present invention, the potential of the drain region of the read cell and the potential of the drain region of the second adjacent cell substantially become the same during the read operation. Furthermore, the drain region of the first adjacent memory cell transistor (this being properly referred to as a "first adjacent cell"), which is also in the floating state, is therefore precharged with the potential equal to that of the drain region of the read cell and the drain region of the second adjacent cell. Therefore, the leak current from the drain node of the read cell to the first adjacent cell is suppressed regardless of the location of the read cell in the array. Therefore, high-speed read can be achieved in comparison with the conventional case.

In one embodiment, the bit line connected to the drain region of the first adjacent memory cell transistor is put into the floating state after being precharged.

In the virtual ground type nonvolatile semiconductor storage device of this one embodiment, the bit line connected to the drain region of the first adjacent cell is put into the floating state after being precharged. Therefore, the drain region of the first adjacent cell is more rapidly precharged to the potential equal to that of the drain region of the read cell and the drain region of the second adjacent cell. Therefore, the drain node of the read cell can be precharged at higher speed, and more rapid read can be achieved.

One embodiment comprises a sense amplifier, which executes sense amplification upon receiving an input corresponding to a potential change of the bit line connected to the drain region of the one memory cell transistor to be subjected to read; and a current-to-voltage converter, which converts a change in a current that flows between the source and the drain of the memory cell transistor into a voltage change and inputs the voltage change into the sense amplifier, while suppressing the potential change of the drain region of the memory cell transistor.

In this one embodiment, during the read operation, the current-to-voltage converter converts the change in the current that flows between the source and the drain regions of the read cell into the voltage change. This sense amplifier executes the sense amplification upon receiving this voltage change as an input. In this case, the current-to-voltage converter suppresses the potential change in the drain region of the read cell even when the read cell is in the ON-state (in the low threshold value state). Therefore, almost no potential difference is generated between the drain node of the read cell and the drain node of the first adjacent cell. Therefore, the leak current from the first adjacent cell to the read cell is suppressed, and high-speed read can be achieved.

In one embodiment, the plurality of memory cells arranged in a direction of column constitute a block;

a block select transistor is interposedly provided at an end portion of each bit line arranged for each block alternately in the direction of row, and the block select transistor arranged on one side in the direction of column and the block select transistor arranged on the other side in the direction of column of the block are turned on and off by two control signals, which are mutually different every other line in the direction of row.

In the virtual ground type nonvolatile semiconductor storage device of this one embodiment, during the read operation, the block select transistors connected to the source region and the drain region of the read cell are each turned on. The block select transistor connected to the drain region of the first adjacent cell is turned off, while the block select transistor connected to the drain region of the second adjacent cell is turned on. By this operation, the read cell is read.

In this case, the block select transistor connected to the drain region of the first adjacent cell can be put into the OFF-state during the precharge operation. Therefore, the load capacity of the bit line connected to the drain region of the first adjacent cell becomes owned by only the portion (sub-bit line) arranged in the block. Therefore, the drain node of the first adjacent cell can be precharged very rapidly in comparison with the case where the load capacity of the main bit line (portion that belongs to the bit line and corresponds to the potential supply side of the block select transistor) is added.

Furthermore, according to another aspect, there is provided a dedicated bit line virtual ground type nonvolatile semiconductor storage device, which has a plurality of nonvolatile memory cell transistors arranged in a matrix form, a plurality of word lines for performing row selection and a plurality of bit lines for performing column selection and in which a source region and a drain region of one memory cell transistor are formed in common with a source region of a memory cell transistor located adjacently on one side in a direction of row and a drain region of a memory cell transistor located adjacently on the other side in the direction of row, respectively, and the source region and the drain region formed in common, are connected to the bit lines, the dedicated bit line virtual ground type nonvolatile semiconductor storage device comprising:

means for applying a ground potential to the bit line connected to the source region of one memory cell transistor to be subjected to read during read;

means for applying a read drain bias potential to the bit line connected to the drain region of the one memory cell transistor;

means for putting the bit line connected to a source region of a first adjacent memory cell transistor located adjacently on the other side in the direction of row of the one memory cell transistor into a floating state; and means for applying a potential equal to the read drain bias potential to the bit line connected to a drain region of a second adjacent memory cell transistor located adjacently on the other side in the direction of row of the first adjacent memory cell transistor.

In the virtual ground type nonvolatile semiconductor storage device of this invention, the potential equal to the read drain bias potential is applied to the bit line connected to the drain region of the second adjacent memory cell transistor during the read operation. The bit line connected to the source region of the first adjacent memory cell transistor is in the floating state, and therefore, the source region of the first adjacent memory cell transistor is precharged with the potential equal to the read drain bias potential. Therefore, the leak current from the drain node of the read cell to the adjacent cell is effectively suppressed.

Moreover, lately for the achievement of a high integration density, it is a frequent practice to constitute a block of a plurality of memory cells connected to the bit line (constructed of a diffusion region), interposingly providing a block select transistor at the end portion of each bit line alternately in the direction of row and apply a potential via the block select transistor. In this case, the read cell and the second adjacent memory cell transistor (this being properly referred to as a "second adjacent cell") are supplied with the potential from the same side in the direction of column. Therefore, the bit line resistance of the read cell and the bit line resistance of the second adjacent cell are substantially the same regardless of the location of the read cell in the array. Therefore, according to the present invention, the potential of the drain region of the read cell and the potential of the drain region of the second adjacent cell substantially become the same during the read operation. Furthermore, the source region of the first adjacent memory cell transistor (this being properly referred to as a "first adjacent cell"), which is also in the floating state, is therefore precharged with the potential equal to that of the drain region of the read cell and the drain region of the second adjacent cell. Therefore, the leak current from the drain node of the read cell to the first adjacent cell is suppressed regardless of the location of the read cell in the array. Therefore, high-speed read can be achieved in comparison with the conventional case.

In one embodiment, the bit line connected to the source region of the first adjacent memory cell transistor is put into the floating state after being precharged.

In the virtual ground type nonvolatile semiconductor storage device of this one embodiment, the bit line connected to the source region of the first adjacent cell is put into the floating state after being precharged. Therefore, the source region of the first adjacent cell is more rapidly precharged to the potential equal to that of the drain region of the read cell and the drain region of the second adjacent cell. Therefore, the drain node of the read cell can be precharged at higher speed, and more rapid read can be achieved.

One embodiment comprises a sense amplifier, which executes sense amplification upon receiving an input corresponding to a potential change of the bit line connected to the drain region of the one memory cell transistor to be subjected to read; and a current-to-voltage converter, which converts a change in a current that flows between the source and the drain of the memory cell transistor into a voltage change and inputs the voltage change into the sense amplifier, while suppressing the potential change of the drain region of the memory cell transistor.

In the virtual ground type nonvolatile semiconductor storage device of this one embodiment, during the read operation, the current-to-voltage converter converts the change in the current that flows between the source and the drain regions of the read cell into the voltage change. This sense amplifier executes sense amplification upon receiving this voltage change as an input. In this case, the current-to-voltage converter suppresses the potential change in the drain region of the read cell even when the read cell is in the ON-state (in the low threshold value state). Therefore, almost no potential difference is generated between the drain node of the read cell and the source node of the first adjacent cell. Therefore, the leak current from the first adjacent cell to the read cell is suppressed, and high-speed read can be achieved.

In one embodiment, the plurality of memory cells arranged in a direction of column constitute a block;

a block select transistor is interposedly provided at an end portion of each bit line arranged for each block alternately in the direction of row, and the block select transistor arranged on one side in the direction of column and the block select transistor arranged on the other side in the direction of column of the block are turned on and off by two control signals which are mutually different every other line in the direction of row.

In the virtual ground type nonvolatile semiconductor storage device of this one embodiment, during the read operation, the block select transistors connected to the source region and the drain region of the read cell are each turned on. The block select transistor connected to the drain region of the first adjacent cell is turned off, while the block select transistor connected to the drain region of the second adjacent cell is turned on. By this operation, the read cell is read.

In this case, the block select transistor connected to the source region of the first adjacent cell can be put into the OFF-state during the precharge operation. Therefore, the load capacity of the bit line connected to the source region of the first adjacent cell becomes owned by only the portion (sub-bit line) arranged in the block. Therefore, the drain node of the first adjacent cell can be precharged very rapidly in comparison with the case where the load capacity of the main bit line (portion that belongs to the bit line and corresponds to the potential supply side of the block select transistor) is added.

Moreover, according to one aspect of this invention, there is provided a bit line control decoder circuit used for a dedicated bit line virtual ground type nonvolatile semiconductor storage device which has a plurality of nonvolatile memory cell transistors arranged in a matrix form, a plurality of word lines for performing row selection and a plurality of bit lines for performing column selection and in which a source region and a drain region of one memory cell transistor are formed in common with a source region of a memory cell transistor located adjacently on one side in a direction of row and a drain region of a memory cell transistor located adjacently on the other side in the direction of row, respectively, and the source region and the drain region formed in common, are respectively connected to the bit lines, the bit line control decoder circuit comprising:

a source bias decoder, which selects a transistor for supplying a source voltage to the bit line connected to the source region of each of the memory cell transistors;

a drain decoder, which selects a drain select transistor (TD0–TD3) by outputting a select signal (D0–D3) to connect the bit line connected to the drain region of each of the memory cell transistors to a sense amplifier; and a drain bias decoder (DBD), which selects a drain bias select transistor (TC0–TC3) to apply a prescribed voltage to the bit line connected to the drain region of the memory cell transistor, and wherein the drain bias decoder (DBD) has two groups of drain bias select signal transfer transistors (DD0–DD3, DR0–DR3), which use, every select signal (D0–D3) outputted by the drain decoder, the select signal as a source, and the drain bias select transistor (TC1), which corresponds to one memory cell transistor, has a gate node connected to the drains of drain bias select signal transfer transistors (DD2, DR0) corresponding to memory cell transistors located next to the one memory cell transistor but one on both sides in the direction of row.

According to the bit line control decoder circuit of this invention, the gate node of the drain bias select transistor (TC1) corresponding to one memory cell transistor is connected to the drains of the drain bias select signal transfer transistors (DD2, DR0) corresponding to the memory cell transistors located next to the one memory cell transistor but one on both sides in the direction of row. Therefore, the drain bias potential equal to that of the bit line connected to the drain of the read circuit can be applied to the bit lines connected to the drains of the memory cell transistors located next to the read circuit but one on both sides in the direction of row. Therefore, the dedicated bit line virtual ground type nonvolatile semiconductor storage device of the above-mentioned invention can produce its operative effects. That is, the leak current from the drain node of the read cell to the first adjacent cell is suppressed regardless of the location of the read cell in the array. Therefore, high-speed read can be achieved in comparison with the conventional case. Furthermore, the bit line control decoder circuit of this invention is constructed comparatively simply without necessitating a substantial increase in the number of transistors.

Moreover, according to one aspect of this invention, there is provided a data read method for a virtual ground type nonvolatile semiconductor storage device, which has a plurality of nonvolatile memory cell transistors arranged in a matrix form, a plurality of word lines for performing row selection and a plurality of bit lines for performing column selection and in which a source region and a drain region of one memory cell transistor are formed in common with a drain region of a memory cell transistor located adjacently on one side in a direction of row and a source region of a memory cell transistor located adjacently on the other side in the direction of row, respectively, and the source and drain regions formed in common, are respectively connected to the bit lines, the data read method comprising the steps of:

applying a ground potential and a read drain bias potential to the bit line connected to the source region and the bit line connected to the drain region, respectively, of one memory cell transistor to be subjected to read, while putting the bit line connected to a drain region of a first adjacent memory cell transistor located adjacently on the other side in the direction of row of the one memory cell transistor into a floating state, and while applying a potential equal to the read drain bias potential to the bit line connected to a drain region of a second adjacent memory cell transistor located adjacently on the other side in the direction of row of the first adjacent memory cell transistor, during read.

According to the data read method of the virtual ground type nonvolatile semiconductor storage device of this invention, the potential equal to the read drain bias potential is applied to the bit line connected to the drain region of the second adjacent memory cell transistor during the read operation. The bit line connected to the drain region of the first adjacent memory cell transistor is in the floating state. Accordingly, the drain region of the first adjacent memory cell transistor is precharged with the potential equal to the read drain bias potential. Therefore, the leak current from the drain node of the read cell to the adjacent cell is effectively suppressed.

Moreover, lately for the achievement of a high integration density, it is a frequent practice to constitute a block of a plurality of memory cells connected to the bit line (constructed of a diffusion region), interposingly providing a block select transistor at the end portion of each bit line alternately in the direction of row and apply a potential via the block select transistor. In this case, the read cell and the second adjacent memory cell transistor (this being properly referred to as a "second adjacent cell") are supplied with the potential from the same side in the direction of column. Therefore, the bit line resistance of the read cell and the bit line resistance of the second adjacent cell are substantially the same regardless of the location of the read cell in the array. Therefore, according to the present invention, the potential of the drain region of the read cell and the potential of the drain region of the second adjacent cell substantially become the same during the read operation. Furthermore, the drain region of the first adjacent memory cell transistor (this being properly referred to as a "first adjacent cell"), which is also in the floating state, is therefore precharged with the potential equal to that of the drain region of the read cell and the drain region of the second adjacent cell. Therefore, the leak current from the drain node of the read cell to the first adjacent cell is suppressed regardless of the location of the read cell in the array. Therefore, high-speed read can be achieved in comparison with the conventional case.

Moreover, according to one aspect of this invention, there is provided a data read method for a dedicated bit line virtual ground type nonvolatile semiconductor storage device, which has a plurality of nonvolatile memory cell transistors arranged in a matrix form, a plurality of word lines for performing row selection and a plurality of bit lines for performing column selection and in which a source region and a drain region of one memory cell transistor are formed in common with a source region of a memory cell transistor located adjacently on one side in a direction of row and a drain region of a memory cell transistor located adjacently on the other side in the direction of row, respectively, and the source region and the drain region formed in common, are respectively connected to the bit lines, the data read method comprising the steps of:

applying a ground potential and a read drain bias potential to the bit line connected to the source region and the bit line connected to the drain region, respectively, of one memory cell transistor to be subjected to read, while putting the bit line connected to a source region of a first adjacent memory cell transistor located adjacently on the other side in the direction of row of the one memory cell transistor into a floating state, and while applying a potential equal to the read drain bias potential to the bit line connected to a drain region of a second adjacent memory cell transistor located adjacently on the other side in the direction of row of the first adjacent memory cell transistor, during read.

According to the data read method of the virtual ground type nonvolatile semiconductor storage device of this invention, the potential equal to the read drain bias potential is applied to the bit line connected to the drain region of the second adjacent memory cell transistor during the read operation. The bit line connected to the source region of the first adjacent memory cell transistor is in the floating state. Accordingly, the source region of the first adjacent memory cell transistor is precharged with the potential equal to the read drain bias potential. Therefore, the leak current from the drain node of the read cell to the adjacent cell is effectively suppressed.

Moreover, lately for the achievement of a high integration density, it is a frequent practice to constitute a block of a plurality of memory cells connected to the bit line (constructed of a diffusion region), interposingly providing a block select transistor at the end portion of each bit line alternately in the direction of row and apply a potential via the block select transistor. In this case, the read cell and the second adjacent memory cell transistor (this being properly referred to as a "second adjacent cell") are supplied with the potential from the same side in the direction of column. Therefore, the bit line resistance of the read cell and the bit line resistance of the second adjacent cell are substantially the same regardless of the location of the read cell in the array. Therefore, according to the present invention, the potential of the drain region of the read cell and the potential of the drain region of the second adjacent cell substantially become the same during the read operation. Furthermore, the source region of the first adjacent memory cell transistor (this being properly referred to as a "first adjacent cell"), which is also in the floating state, is therefore precharged with the potential equal to that of the drain region of the read cell and the drain region of the second adjacent cell. Therefore, the leak current from the drain node of the read cell to the first adjacent cell is suppressed regardless of the location of the read cell in the array. Therefore, high-speed read can be achieved in comparison with the conventional case.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
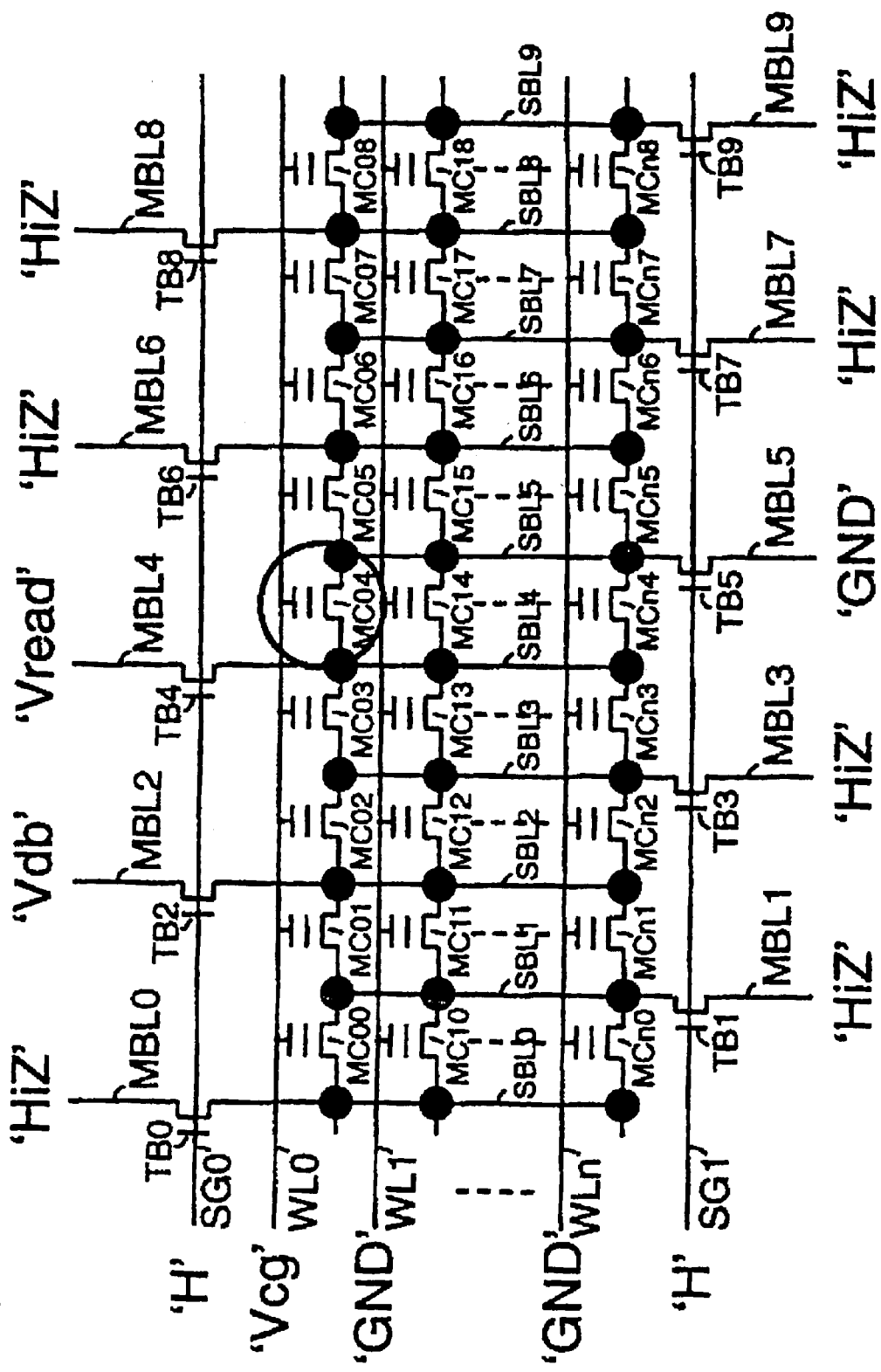
FIG. 1 is a diagram showing the circuit construction and the voltage application condition of the memory array of a virtual ground type nonvolatile semiconductor storage device according to one embodiment of the present invention.

This invention will be described in detail below on the basis of the embodiments shown in the drawings.

FIG. 1 shows the circuit construction of a memory array of a virtual ground type nonvolatile semiconductor storage device of one embodiment. The memory array is the virtual ground type, and the figure shows one block out of a plurality of blocks of memory array. An ACT (Asymmetrical Contactless Transistor) cell is used as a memory cell.

Figure 9A:
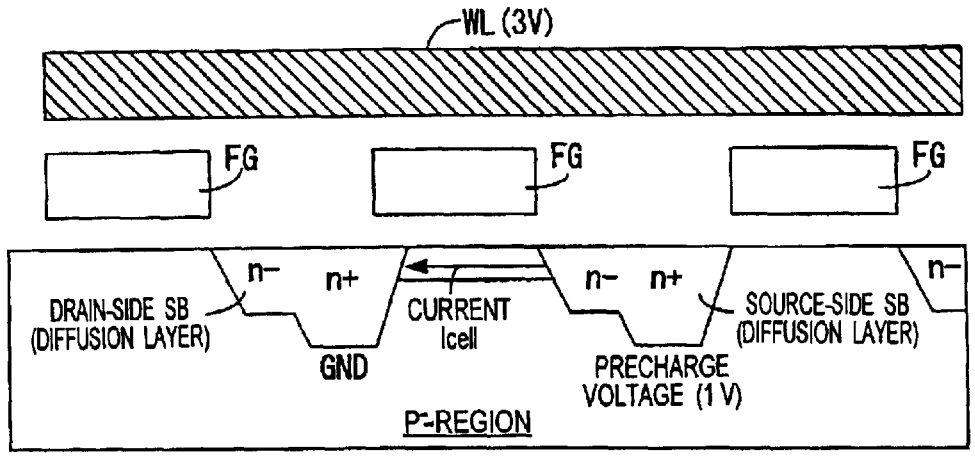
FIGS. 9A, 9B and 9C are diagrams for schematically explaining the read, write and erase operations in an ACT cell.

The ACT cell operates as follows. It is to be noted that the FN (Fowler-Nordheim) tunneling effect is used for write and erase. Read and verify operations will be described first. Read and verify operations are executed in same manner. During read, as shown in FIG. 9A, a read voltage (verify voltage) is applied to a word line WL of a transistor that constitutes each memory cell, and a voltage of 1 V is applied to a source-side sub-bit line SB. Then, a sense amplifier executes sense amplification to decide whether the precharge voltage of 1 V is lowered for the reason that a current flows toward a grounded drain-side sub-bit line SB. By this operation, the ON/OFF-state of the memory cell transistor is determined.

Figure 9B:
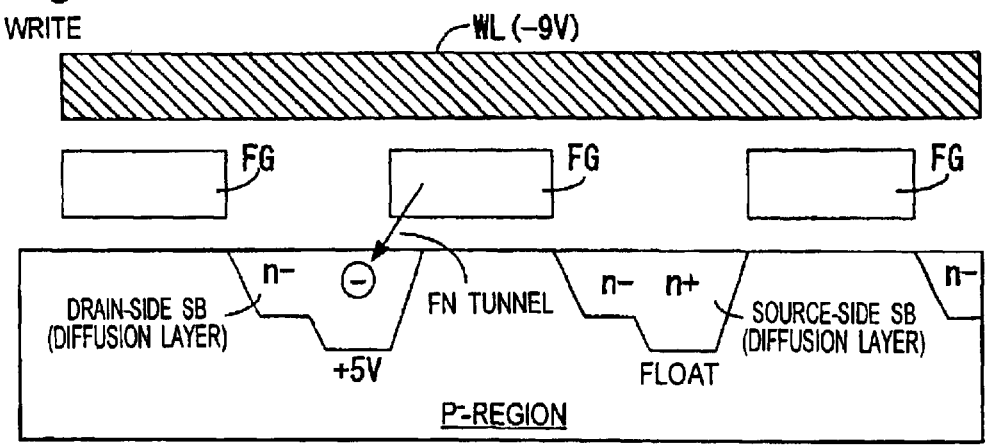

During write, as shown in FIG. 9B, a negative voltage is applied to the gate of the transistor that constitutes each memory cell, a positive voltage is applied to the sub-bit line SB located on the drain side, and the sub-bit line SB located on the source side is put into the floating state. Then, the FN tunneling phenomenon occurs between the $n^+$-side of the sub-bit line SB located on the drain side and the floating gate FG, as a consequence of which the electrons are extracted from the floating gate FG to the sub-bit line SB located on the drain side. Thus, the write is executed by lowering the threshold voltage of the transistor.

Figure 9C:
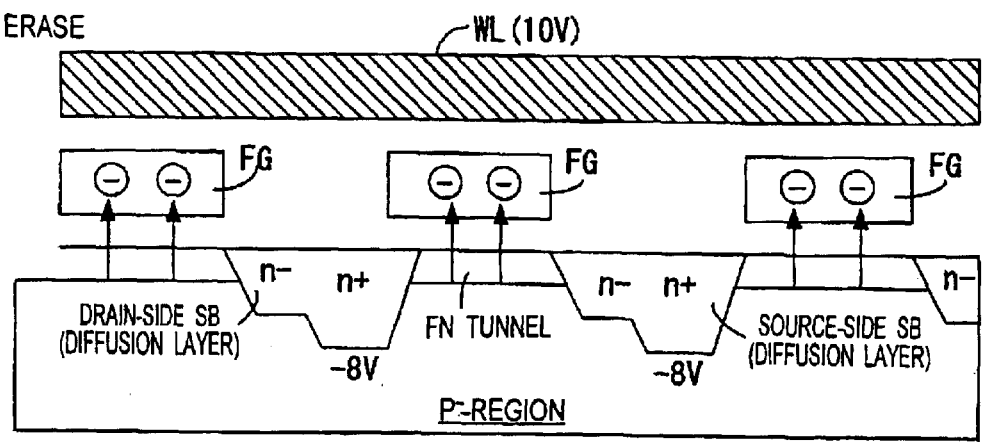
Figure 10:
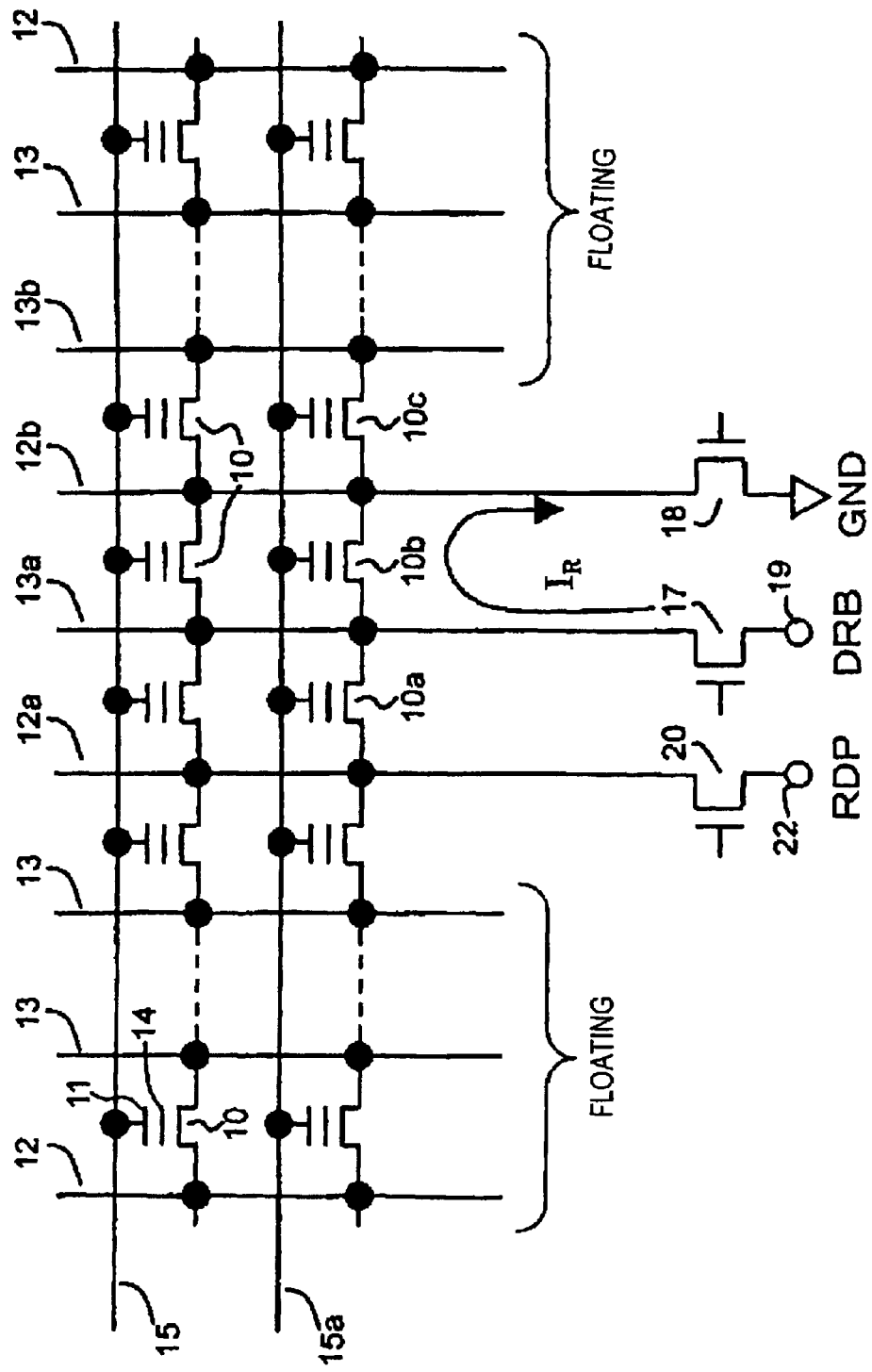
FIG. 10 is a diagram illustrating the construction of a conventional virtual ground type nonvolatile semiconductor storage device.
Figure 11:
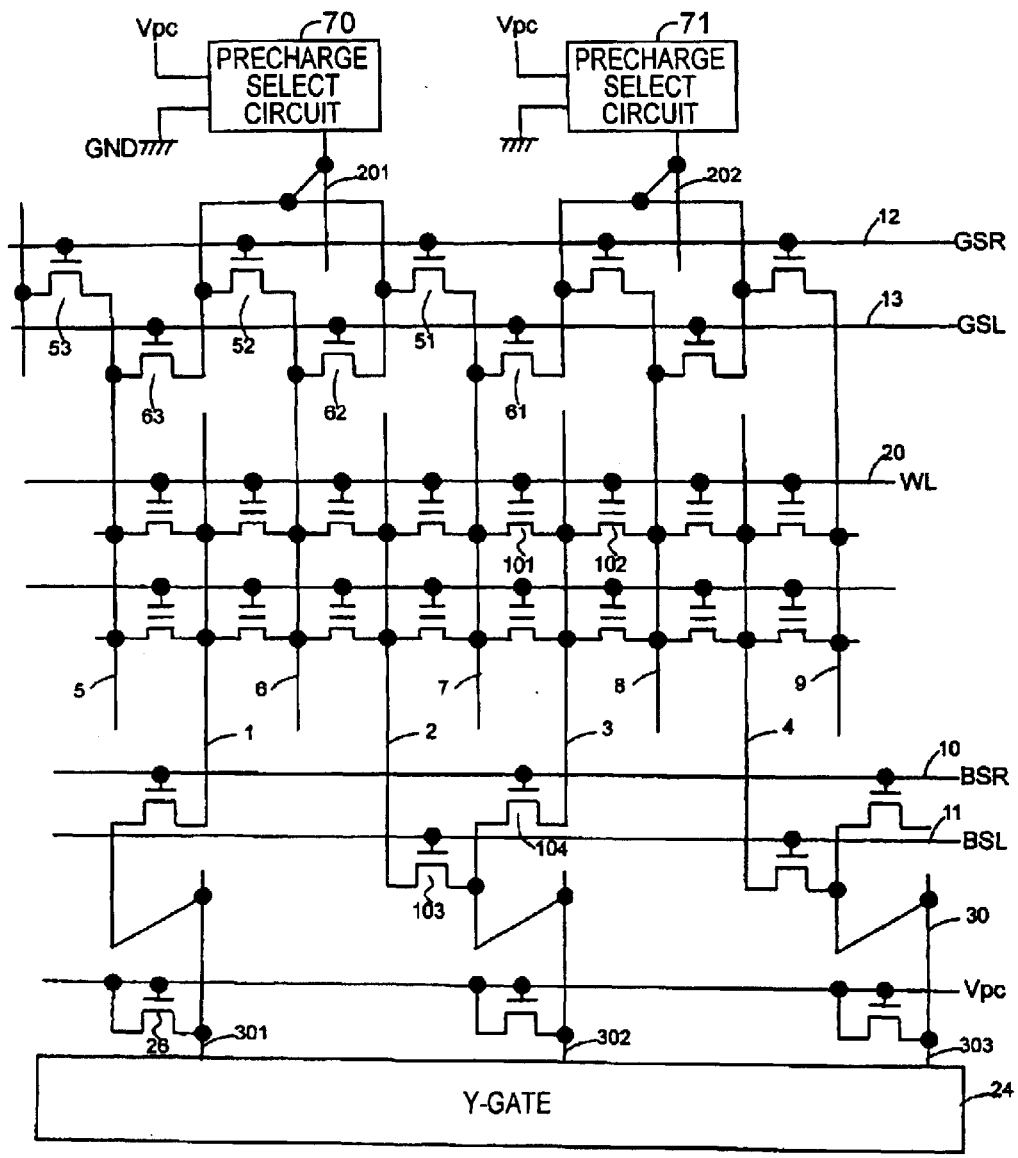
FIG. 11 is a diagram illustrating the construction of another conventional virtual ground type nonvolatile semiconductor storage device.

On the other hand, during erase, as shown in FIG. 9C, a high voltage is applied to the gate of the transistor that constitutes each memory cell, and a negative voltage is applied to the sub-bit lines SB located on the drain side and the source side and to the substrate ($p^-$-region). Then, the FN tunneling phenomenon occurs between the channel region of the substrate and the floating gate FG, as a consequence of which the electrons are injected into the floating gate FG. Thus, the erase is executed by raising the threshold voltage of the transistor.

In FIG. 1 are shown diffusion bit lines (sub-bit lines) SBL0–SBLn, and two adjoining memory cells share the diffusion bit line SBL. This block is selected by selecting block select lines SG0 and SG1 by a block select signal, consequently connecting the diffusion bit lines SBL0–SBLn to the main bit lines MBL0–MBLn shared by a plurality of blocks via block select transistors TB0–TBn. There are word lines WL0–WLn, which are connected to the control gate of the memory cells.

Operation when the read is executed by selecting the memory cell MC04 (enclosed by a circle in the figure) in this memory array will be described. All the bit lines are preliminarily made to have a ground potential GND. First of all, a word line WL0 is selected, and a read voltage Vcg is applied to the control gate of the read cell MC04. At the same time, block select lines SG0 and SG1 are made to have H-level to turn on the block select transistors TB0–TBn for the selection of this block, connecting the diffusion bit lines SBL to the corresponding main bit lines MBL. Next, a read drain voltage Vread is applied to the MBL4 out of the main bit lines MBL, and a drain bias Vdb of a potential equal to Vread is applied to MBL2. Moreover, the other main bit lines MBL are put into the floating state of 0 V.

At this time, the drain bias Vdb has the potential equal to the read drain voltage Vread, and therefore, the drain voltage applied to the drain of the read cell MC04 and the drain voltage of a second adjacent cell MC02 to which the drain bias is applied come to have same potential by applying the drain bias from the same block select transistor side. Further, the drain voltage of the first adjacent cell MC03 is also precharged with same potential by being charged from the diffusion bit lines located on both sides. Therefore, a leak current from the diffusion bit line SBL4 to the first adjacent cell MC03 can be prevented, and this enables the suppression of an increase in the precharge time of the read drain voltage. As a result, high-speed read can be achieved.

Figure 7:
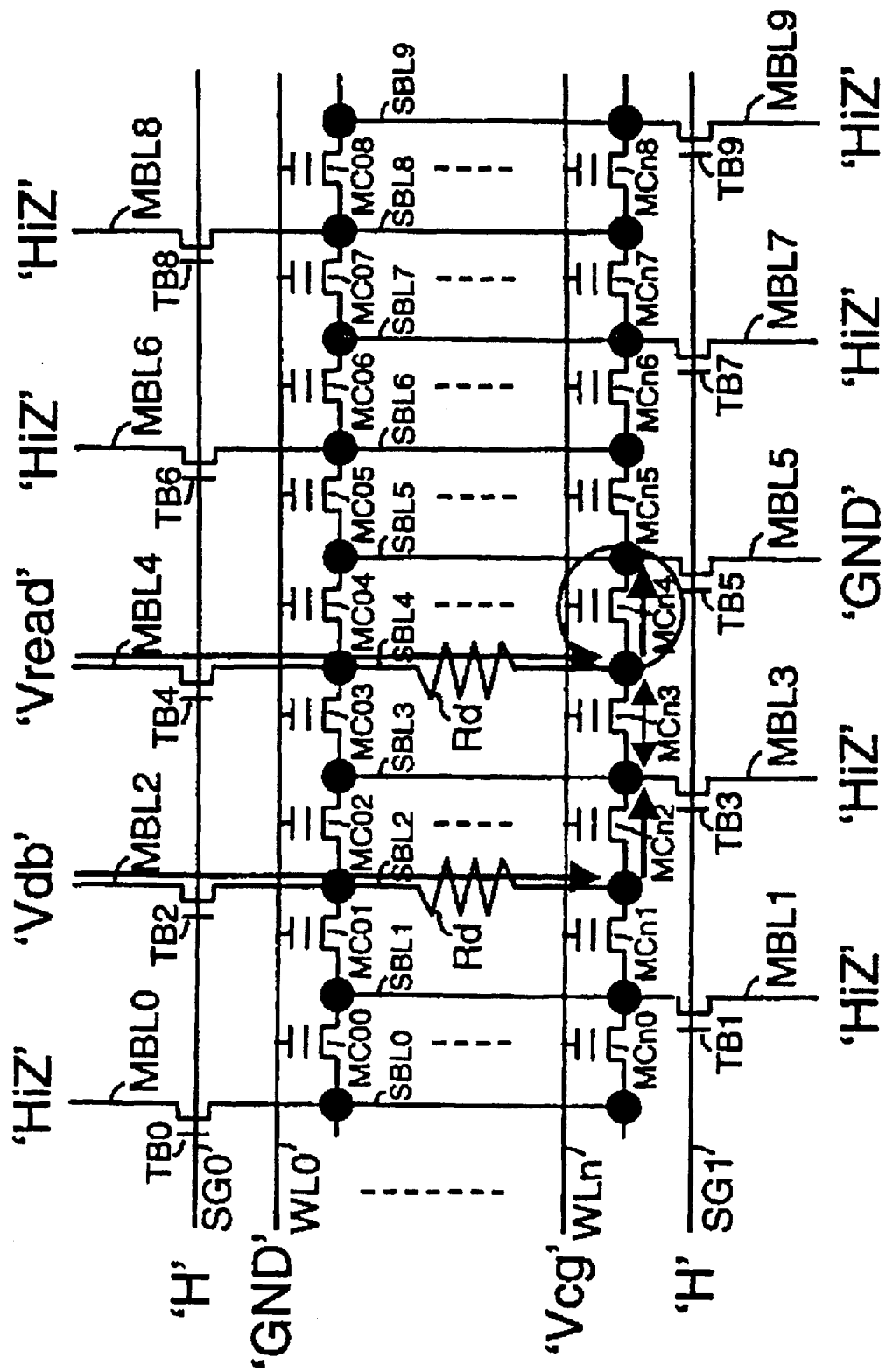
FIG. 7 is an explanatory view of the operation of the embodiment shown in FIG. 1.

FIG. 7 is an example in which the drain of the read cell is located farthest from the block select transistor. When a memory cell MCn4 is read, the read drain voltage Vread comes to have a value that has undergone a voltage drop due to a parasitic resistance Rd of the diffusion bit line SBL4. At this time, the drain bias Vdb is applied to the diffusion bit line SBL2 in order to prevent the leak current, and the voltage drop is caused by the parasitic resistance Rd of the diffusion bit line SBL2. Accordingly, the diffusion bit lines SBL come to have same parasitic resistance, and therefore, the drain voltage of the read cell MCn4 and the drain voltage of the first adjacent cell MCn3 come to have almost same potential. Therefore, a current outflow from the drain of the read cell MCn4 to the first adjacent cell MCn3 and a current inflow from the first adjacent cell MCn3 to the read cell MCn4 can be suppressed. As a result, high-speed read can be achieved.

Figure 2:
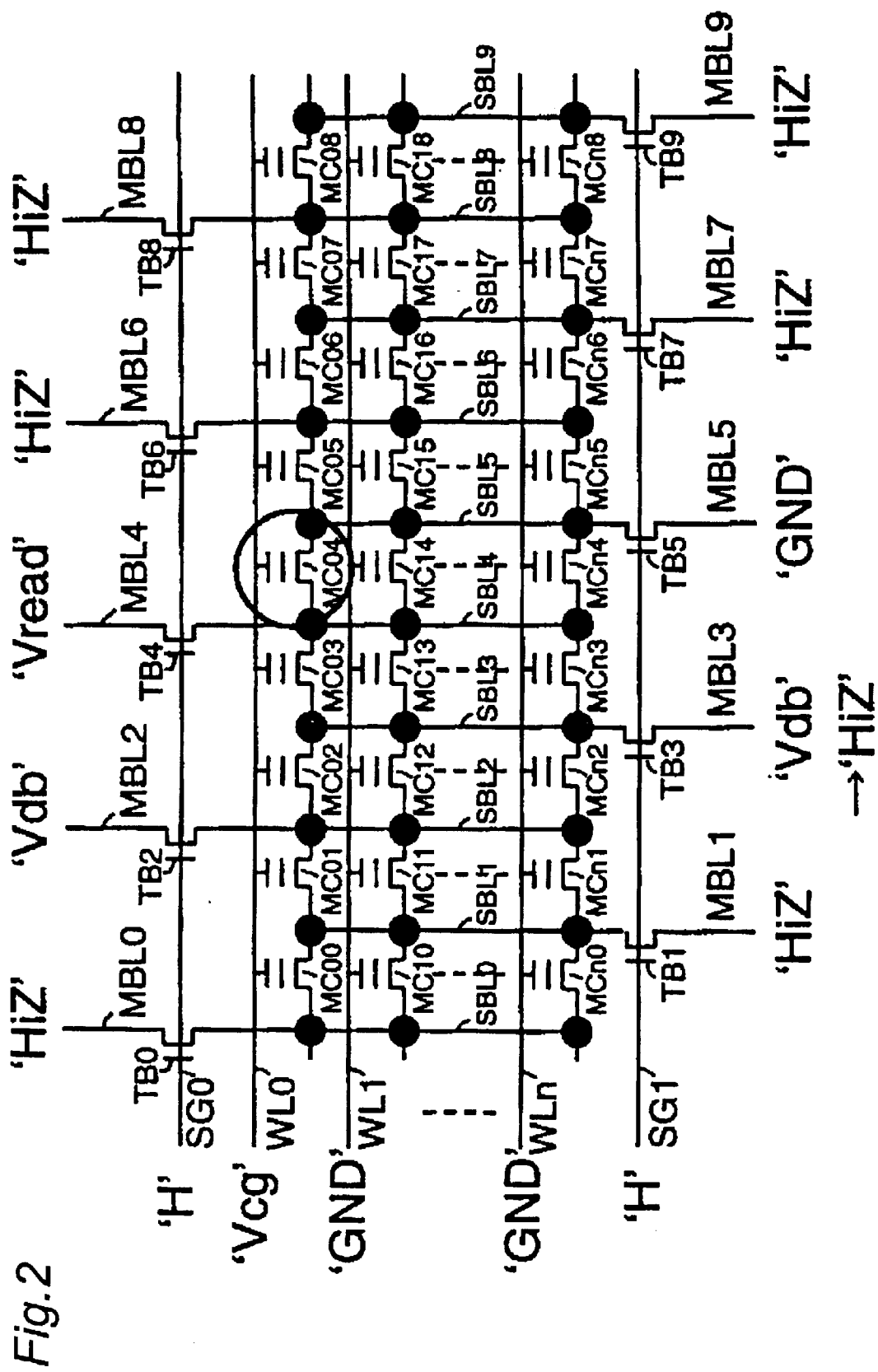
FIG. 2 is a diagram showing another voltage application condition of the above virtual ground type nonvolatile semiconductor storage device.

FIG. 2 shows an example in which a voltage application condition different from the aforementioned one is adopted in the memory array of FIG. 1. Operation when the memory cell MC04 is selected and read similarly to the aforementioned example will be described. First of all, the word line WL0 is selected, and the read voltage Vcg is applied to the control gate of the read cell MC04. At the same time, the block select lines SG0 and SG1 are made to have H-level to turn on the block select transistors TB0–TBn for the selection of this block. The diffusion bit lines SBL are connected to the corresponding main bit lines MBL. Next, the read drain voltage Vread is applied to MBL4 out of the main bit lines MBL, and the drain bias Vdb of a potential equal to Vread is applied to MBL2. Further, the voltage Vdb is applied to MBL3, the drain node of the first adjacent cell MC03 is precharged and thereafter put into the floating state. Moreover, the other main bit lines MBL are put into the floating state.

At this time, the drain node of the first adjacent cell MC03, which is precharged with a voltage lower than Vdb due to the resistance of the diffusion bit line SBL3, is put into the floating state after being precharged. Accordingly, the drain node is further charged up to the drain bias Vdb via the second adjacent cell MC02. Therefore, the drain voltage applied to the drain of the read cell MC04 and the drain voltage of the first adjacent cell MC03 come to have same potential, and this enables the prevention of the leak current from the diffusion bit line SBL4 to the first adjacent cell MC03 and the suppression of an increase in the precharge time of the read drain voltage. As a result, high-speed read can be achieved.

Figure 3:
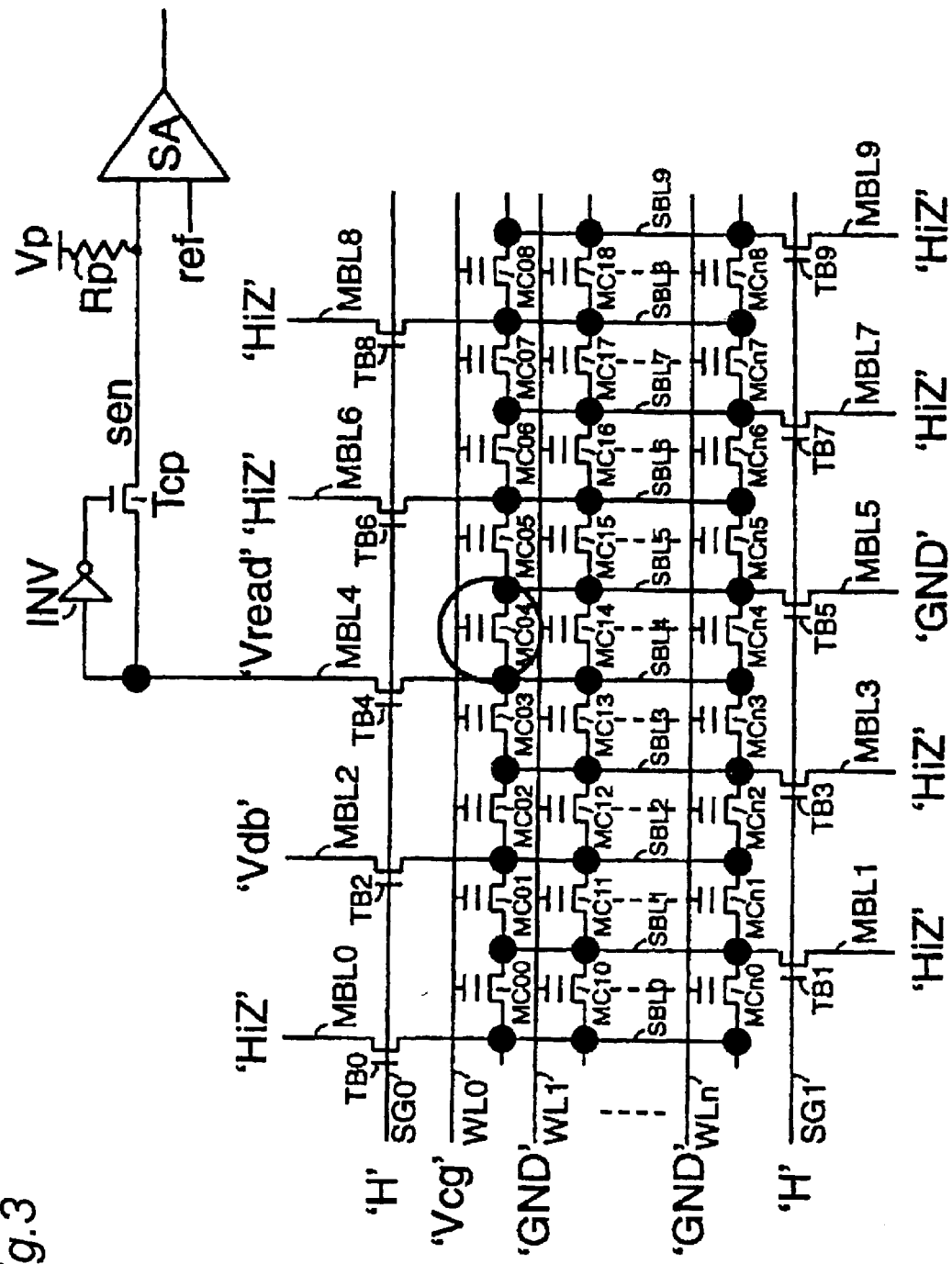
FIG. 3 is a diagram showing an embodiment in which a read circuit is added to the memory array of the above virtual ground type nonvolatile semiconductor storage device.

FIG. 3 shows an example in which a read circuit is added to the memory array shown in FIG. 1. This read circuit includes a clamp transistor Tcp and an inverter circuit INV. It is to be noted that SA denotes a sense amplifier SA.

The source of the clamp transistor Tcp is connected to the main bit line MBL of the read cell. The gate of the clamp transistor Tcp receives the output signal of an inverter circuit INV that inverts and amplifies the voltage of the main bit line MBL. The drain of the clamp transistor Tcp is pulled up with a potential Vp via a resistor Rp and connected to the input node sen of the sense amplifier SA. The sense amplifier SA is constructed of a differential amplifier of a current sensing type and executes sense amplification by comparing the potential at the output node ref of a read reference cell (memory cell with a threshold voltage intermediate between the ON-state and the OFF-state) with the potential of the input node sen. This read circuit operates as a current-to-voltage converter for converting a change in the read cell current into a change in the drain voltage of the clamp transistor Tcp while suppressing a change in the bit line read drain voltage.

Operation when the memory cell MC04 is selected and read with this circuit construction will be described. First of all, the word line WL0 is selected to apply the read voltage Vcg to the control gate of the read cell MC04. At the same time, the block select lines SG0 and SG1 are made to have H-level to turn on the block select transistors TB0–TBn for the selection of this block. The diffusion bit lines SBL are connected to the corresponding main bit lines MBL. Next, the read drain voltage Vread is applied to MBL4 out of the main bit lines MBL, and the drain bias Vdb of the potential equal to Vread is applied to MBL2. Moreover, the other main bit lines MBL are put into the floating state.

At this time, the drain bias Vdb has the potential equal to the read drain voltage Vread, and therefore, the drain voltage applied to the drain of the read cell MC04 and the drain voltage of the second adjacent cell MC02 to which the drain bias is applied come to have same potential by applying the drain bias from the same block select line SG side. Further, the drain voltage of the first adjacent cell MC03 is also precharged with same potential by being charged from the diffusion bit lines located on both sides. When the sense amplifier SA becomes active in this state, the read operation is executed as follows according to the ON/OFF-state of the read cell MC04.

No cell current flows when the read cell MC04 is in the OFF-state, and therefore, the potential of Vread maintains the precharge potential. At this time, the precharge voltage Vdb at the drain node of the first adjacent cell MC03 and Vread have almost same potential, and therefore, no leak to the first adjacent cell MC03 occurs. Therefore, no overhead occurs with regard to the read time.

Figure 8:
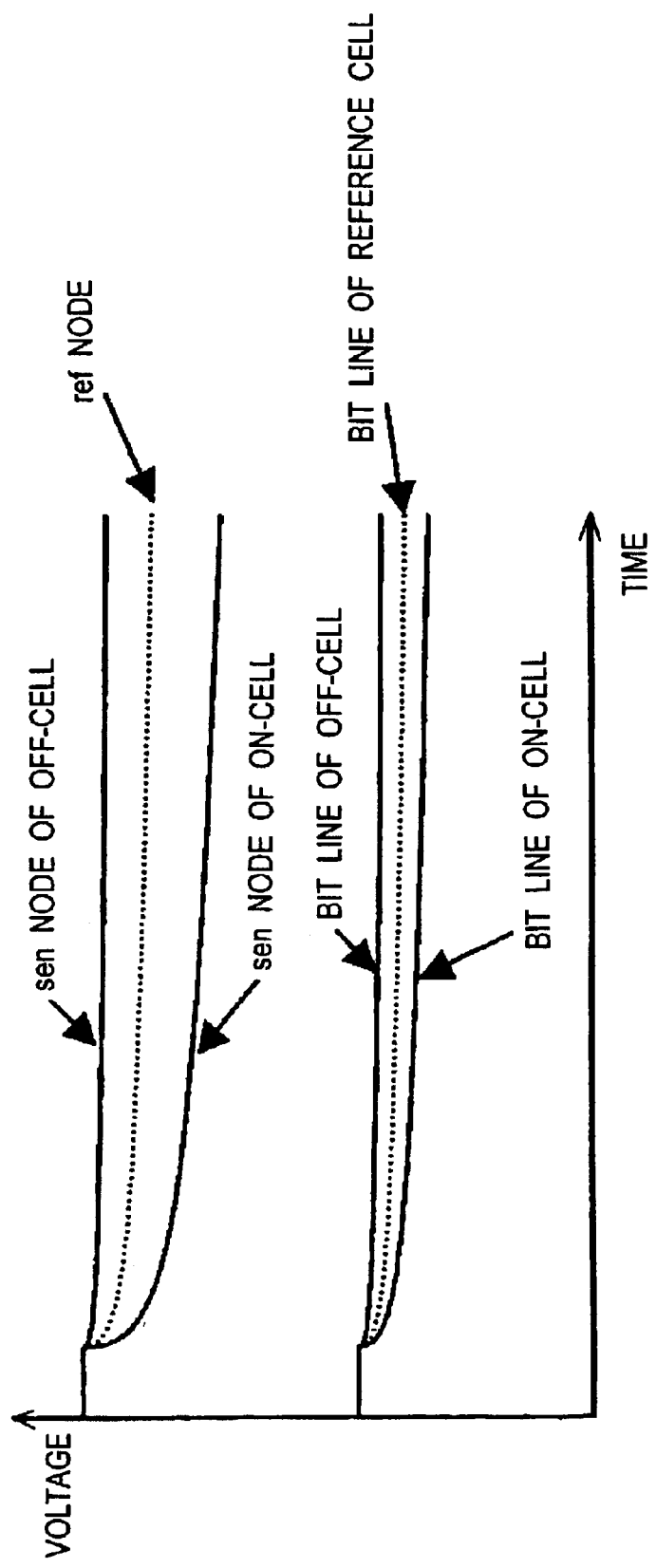
FIG. 8 is an explanatory view of the operation of the read circuit of the embodiment shown in FIG. 5.

When the read cell MC04 is in the ON-state, a cell current flows from the drain region to the source region of this read cell MC04, and the voltage Vread is lowered. At this time, in the case of the read circuit that directly executes the sense amplification of the bit line potential, a potential difference between the drain bias Vdb of the first adjacent cell MC03 and Vread is increased to an extent that it cannot be ignored, and a leak current flows from the drain node of the first adjacent cell MC03, causing a reduction in the current of the read node. This causes a problem that the read cell MC04, which is even in the ON-state, is erroneously read as if it were in the OFF-state. However, the above read circuit is constructed so that the clamp transistor Tcp operates so as to maintain the bit line voltage almost constant and so that a cell current difference is converted as a voltage difference at the sense node sen, and therefore, a fluctuation on the bit line at this time is very little (0.1 V, for example). FIG. 8 shows the behavior of the bit line and the sense node in the read operation. As shown in the figure, the voltage at the sense node sen is largely changed with respect to the minute change of the bit line voltage. Therefore, a voltage difference between the precharge voltage Vdb at the drain node of the first adjacent cell MC03 and Vread is a little, there occurs no such problem that the leak current flows into the drain of the read cell MC04 via the first adjacent cell MC03. Therefore, no overhead occurs with regard to the read time.

If the array construction is made to be a dedicated bit line virtual ground type in the aforementioned embodiment, then the array construction becomes adaptable by changing the decoder for selecting the bit line. Moreover, the embodiment has been described taking the case of the ACT memory cell employed as a memory cell as an example, the present invention is not limited to this and is adaptable to another nonvolatile memory cell.

Figure 4:
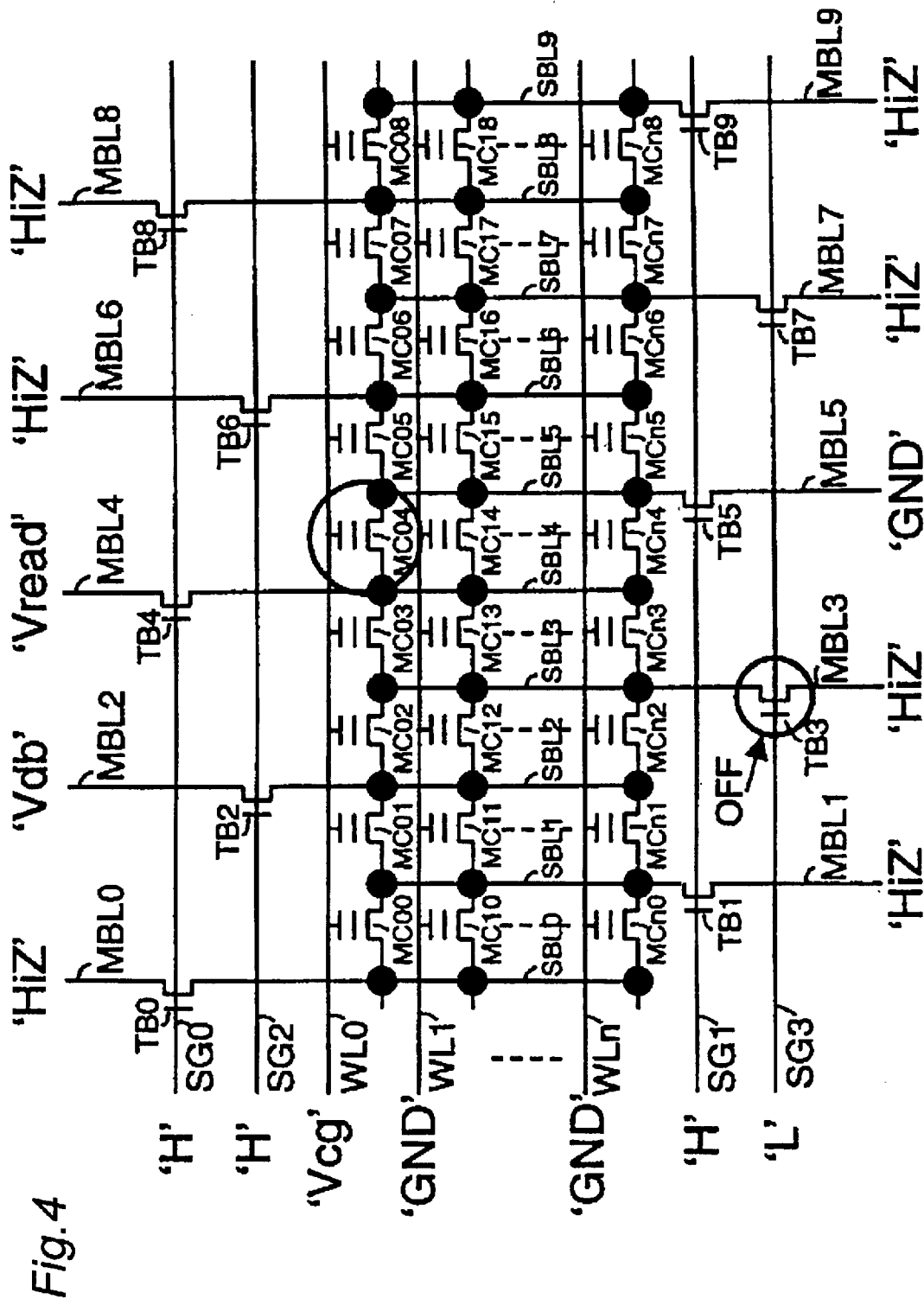
FIG. 4 is a diagram showing a modification example, in which block select transistors are controlled to be turned on and off by mutually different two block select signals SG1 and SG3 alternately in the direction of row at the end portions of diffusion bit lines in the above virtual ground type nonvolatile semiconductor storage device.

As shown in FIG. 4, it is acceptable to control block select transistors TB0, TB2, TB4, TB6 and TB8, which are arranged on the upper side in the direction of column of the diffusion bit line SBL, so as to turn the transistors on and off by mutually different two block select signals SG0 and SG2 every other line in the direction of row and control block select transistors TB1, TB3, TB5, TB7 and TB9, which are arranged on the lower side in the direction of column, so as to turn the transistors on and off by mutually different two block select signals SG1 and SG3 every other line in the direction of row.

With this circuit construction, during the read operation, the block select transistors TB4 and TB5 connected to the source region and the drain region of the read cell MC04 are each turned on, the block select transistor TB3 connected to the drain region of the first adjacent cell MC03 is turned off, and the block select transistor TB2 connected to the drain region of the second adjacent cell MC02 is turned on. By this operation, the read cell MC04 is read.

In this case, the block select transistor TB3 connected to the drain region of the first adjacent cell MC03 can be put into the OFF-state during the precharge operation. Accordingly, a load capacity of the bit line connected to the drain region of the first adjacent cell MC03 belongs only to the diffusion bit line SBL3 arranged in the block. Therefore, in comparison with the case where the load capacity of the main bit line MBL3 is added, the drain node of the first adjacent cell MC03 can be precharged at very high speed. As a result, high-speed read can be achieved.

Figure 5:
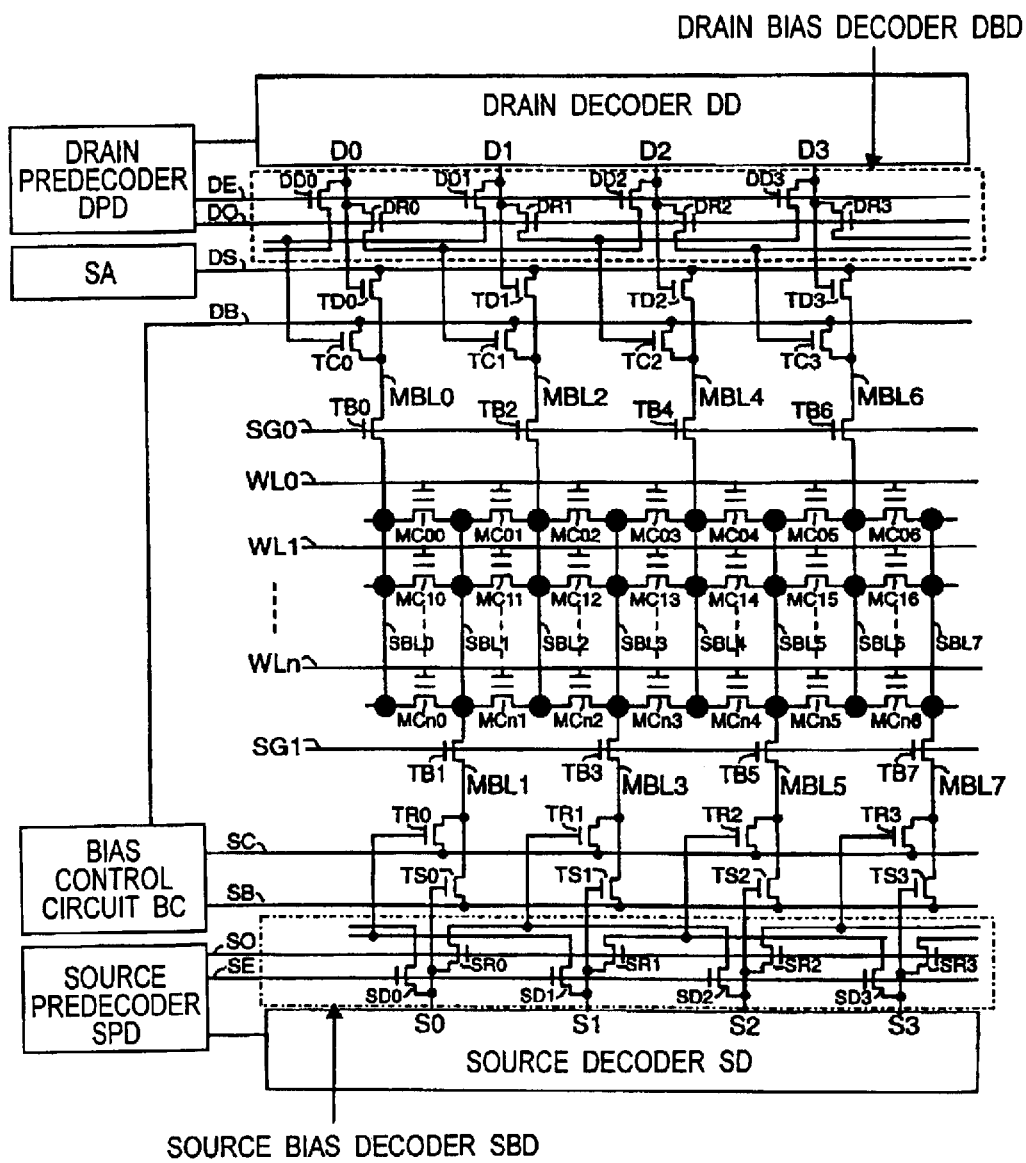
FIG. 5 is a diagram showing the construction of the memory array and the decoder circuit of a virtual ground type nonvolatile semiconductor storage device according to another embodiment of the present invention.
Figure 6:
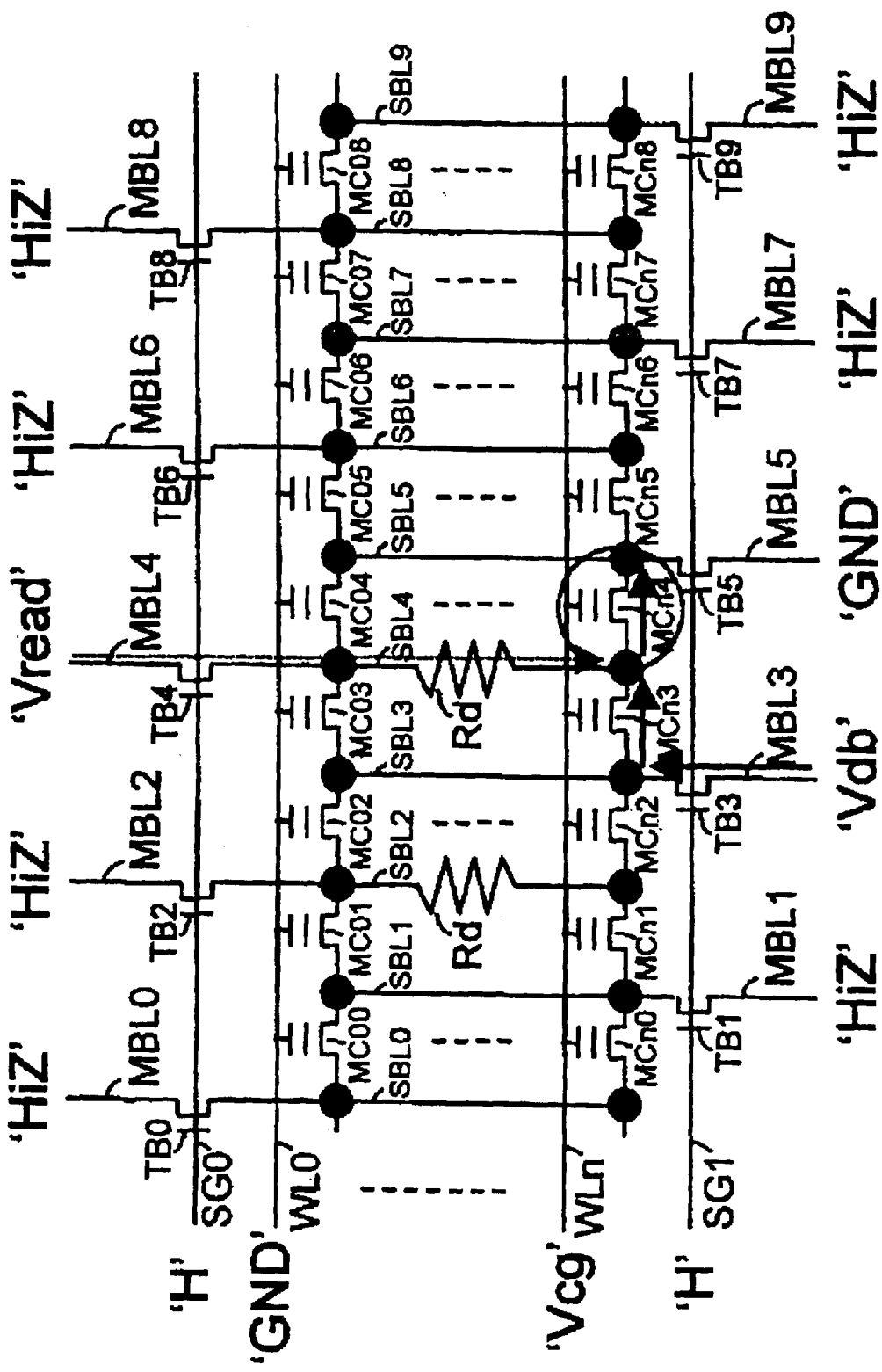
FIG. 6 is a diagram showing the problems under the conventional voltage application conditions.

FIG. 5 shows the construction of the memory array and the decoder circuit of a virtual ground type nonvolatile semiconductor storage device of another embodiment. The memory array is the dedicated bit line virtual ground type, and the figure shows one block out of a plurality of blocks of the memory array.

Diffusion bit lines SBL0, SBL2, SBL4, . . . and diffusion bit lines SBL1, SBL3, SBL5, . . . are formed of buried diffusion layers of different concentration profiles. During the read operation, the diffusion bit lines SBL0, SBL2, SBL4, . . . are each used as a drain node, and the diffusion bit lines SBL1, SBL3, SBL5, . . . are each used as a source node. This block is selected by selecting the block select lines SG0 and SG1 according to a block select signal, and the diffusion bit lines SBL0–SBLn are connected to the main bit lines MBL0–MBLn shared by the plurality of blocks via the block select transistors TB0–TBn, respectively. There are word lines WL0–WLn, which are connected to the control gates of the respective memory cells.

The decoder circuit in FIG. 5 will be described next. With regard to drain select transistors TD0–TDn, nodes D0–Dn, from which one is selected by a drain decoder DD, are connected to the gates of the drain select transistors TD0–TDn, and the drain node of the selected memory cell is connected to a node DS from a sense amplifier SA. The portion enclosed by a dashed line is a drain bias decoder DBD. This drain bias decoder DBD is constructed of drain bias select signal transfer transistors DD0–DDn and DR0–DRn, which are selected by nodes DE and DO from a drain predecoder DPD. The drain predecoder DPD selects DE or DO according to the selected memory cell. One of the drain bias select transistors TC0–TCn is selected by the drain bias decoder DBD, and the bit line, to which the drain bias is to be applied, is connected to a node DB from a bias control circuit BC. The source select transistors TS0–TSn have gates connected to nodes S0–Sn, one of which is selected by the source decoder SD, and the source node of the selected memory cell is connected to a node SB from the bias control circuit BC. The portion enclosed by a chain line is a source bias decoder SBD. This source bias decoder SBD is constructed of source bias select signal transfer transistors SD0–SDn and SR0–SRn, which are selected by nodes SE and SO from a source predecoder SPD. The source predecoder SPD selects SE or SO according to the selected memory cell. Moreover, the source bias select transistors TR0–TRn operate in the case of a read system to put the source node of the first adjacent cell (cell that shares the drain node with the read cell) into the floating state after precharge during read. In concrete, one of the source bias select transistors TR0–TRn is selected by the source bias decoder SBD, and the bit line, to which the source bias is to be applied, is connected to the node SB from the bias control circuit BC.

Operation when the memory cell MC02 is selected and read with the circuit construction of FIG. 5 will be described. All the bit lines are preliminarily made to have the ground potential GND. First of all, the word line WL0 is selected, and the read voltage Vcg is applied to the control gate of the read cell MC02. At the same time, the block select lines SG0 and SG1 are made to have H-level to turn on the block select transistors TB0–TBn for the selection of this block, connecting the diffusion bit lines SBL to the corresponding main bit lines MBL. Moreover, a node D1 is selected by the drain decoder DD, and a node S1 is selected by the source decoder SD, consequently turning on the drain select transistor TD1 and the source select transistor TS1, respectively, connecting the drain node of the read cell MC02 to the sense amplifier SA and connecting the source node to the bias control circuit BC. Moreover, a node DE is selected by the drain predecoder DPD, consequently turning on the drain bias select signal transfer transistors DD0–DD3 of the drain bias decoder DBD. At this time, the node D1 is selected by the drain decoder DD. Therefore, the drain bias select transistor TC0 is turned on via the drain bias select signal transfer transistor DD1, consequently connecting the drain node of the second adjacent cell MC00 to the bias control circuit BC.

Next, the bias control circuit BC sets the drain bias node DB to Vdb and sets the source bias node SB to GND, and the sense amplifier SA further applies the read voltage Vread to the node DS. Therefore, Vread is applied to the drain of the read cell MC02, and GND is applied to the source. Further, Vdb is applied to the drain node of the second adjacent cell MC00 located leftwardly next to the read cell MC02 but one in the direction of row, as a consequence of which the source node of the first adjacent cell MC01 is precharged with a potential equal to Vread and Vdb via the first adjacent cell MC01 and the second adjacent cell MC00 from the floating state of 0 V.

According to the voltage applying method described above, the drain bias Vdb has a potential equal to the read drain voltage Vread, and by applying the drain bias from the same block select transistor side, the drain voltage applied to the drain of the read cell MC02 and the drain voltage of the second adjacent cell MC00, to which the drain bias is applied, come to have same potential. Further, the source voltage of the first adjacent cell MC01 is also precharged with the same potential by being charged from the diffusion bit lines located on both sides. Therefore, the leak current from the drain node of the read cell MC02 via the first adjacent cell MC01 can be prevented, and an increase in the precharge time of the drain node can be suppressed. Moreover, the current inflow from the source node of the first adjacent cell MC01 to the drain node of the read cell MC02 can also be suppressed. As a result, high-speed read can be achieved.

Operation when the memory cell MC03 is selected and read with the circuit construction of FIG. 5 will be described next. All the bit lines are preliminarily made to have the ground potential GND. First of all, the word line WL0 is selected, and the read voltage Vcg is applied to the control gate of the read cell MC03. At the same time, the block select lines SG0 and SG1 are made to have H-level to turn on the block select transistors TB0–TBn for the selection of this block, connecting the diffusion bit lines SBL to the corresponding main bit lines MBL. Moreover, a node D2 is selected by the drain decoder DD, and the node S1 is selected by the source decoder SD, consequently turning on the drain select transistor TD2 and the source select transistor TS1, respectively, connecting the drain node of the read cell MC03 to the sense amplifier SA and connecting the source node to the bias control circuit BC. Moreover, a node DO is selected by the drain predecoder DPD, consequently turning on the drain bias select signal transfer transistors DR0–DR3 of the drain bias decoder DBD. At this time, the node D2 is selected by the drain decoder DD. Therefore, the drain bias select transistor TC3 is turned on via the drain bias select signal transfer transistor DR2, consequently connecting the drain node of MC05 to the bias control circuit BC.

Next, the bias control circuit BC sets the drain bias DB to Vdb and sets the source bias SB to GND, and the sense amplifier SA further applies the read voltage Vread to the node DS. Therefore, Vread is applied to the drain of the read cell MC03, and GND is applied to the source. Further, Vdb is applied to the drain node of the second adjacent cell MC05 located rightwardly next to the read cell MC03 but one in the direction of row, as a consequence of which the source node of the first adjacent cell MC04 is precharged with a potential equal to Vread and Vdb via the first adjacent cell MC04 and the second adjacent cell MC05 from the floating state of 0 V.

According to the voltage applying method described above, the drain bias Vdb has a potential equal to the read drain voltage Vread, and by applying the drain bias from the same block select transistor side, the drain voltage applied to the drain of the read cell MC03 and the drain voltage of the second adjacent cell MC05, to which the drain bias is applied, come to have same potential. Further, the source voltage of the first adjacent cell MC04 is also precharged with the same potential by being charged from the diffusion bit lines located on both sides. Therefore, the leak current from the drain node of the read cell MC03 via the first adjacent cell MC04 can be prevented, and an increase in the precharge time of the drain node can be suppressed. Moreover, the current inflow from the source node of the first adjacent cell MC04 to the drain node of the read cell MC03 can also be suppressed. As a result, high-speed read can be achieved.

Operation when the memory cell MC02 is selected and read with the circuit construction of FIG. 5 and the source node of the first adjacent cell MC01 is concurrently precharged (floating during the sense amplification) will be described next. All the bit lines are preliminarily made to have the ground potential GND. First of all, the word line WL0 is selected, and the read voltage Vcg is applied to the control gate of the read cell MC02. At the same time, the block select lines SG0 and SG1 are made to have H-level to turn on the block select transistors TB0–TBn for the selection of this block, connecting the diffusion bit lines SBL to the corresponding main bit lines MBL. The node D1 is selected by the drain decoder, and the node S1 is selected by the source decoder SD, consequently turning on the drain select transistor TD1 and the source select transistor TS1, respectively, connecting the drain node of the read cell MC02 to the sense amplifier SA and connecting the source node to the bias control circuit BC. Moreover, the node DE is selected by the drain predecoder DPD, consequently turning on the drain bias select signal transfer transistors DR0–DR3 of the drain bias decoder DBD. At this time, the node D1 is selected by the drain decoder DD. Therefore, the drain bias select transistor TC0 is turned on via the drain bias select signal transfer transistor DD1, consequently connecting the drain node of the second adjacent cell MC00 to the bias control circuit BC.

At the same time, the node SE is selected by the source predecoder SPD, consequently turning on the source bias select signal transfer transistors SD0–SD3 of the source bias decoder SBD. At this time, the node S1 is selected by the source decoder SD. Therefore, the source bias select transistor TR0 is turned on by the source bias select signal transfer transistor SD1, and the source node of the first adjacent cell MC01 is connected to the bias control circuit BC.

Next, the bias control circuit BC sets the drain bias DB to Vsb, sets the source bias SC to Vsb and sets the source bias SB to GND. Further, the read voltage Vread is applied to the node DS by the sense amplifier SA. Therefore, Vread is applied to the drain of the read cell MC02, and GND is applied to the source. Further, Vdb is applied to the drain node of the second adjacent cell MC00 located leftwardly next to the read cell MC02 but one in the direction of row, and Vsb is applied to the source node of the first adjacent cell MC01. When the precharge ends, the node SC is put into the floating state by the bias control circuit BC.

According to the voltage applying method described above, the drain bias Vdb has a potential equal to the read drain voltage Vread, and by applying the drain bias from the same block select transistor side, the drain voltage applied to the drain of the read cell MC02 and the drain voltage of the second adjacent cell MC00, to which the drain bias is applied, come to have same potential. Further, the source voltage of the first adjacent cell MC01, which is also charged with Vsb and put into the floating state after being charged, is therefore precharged with a potential equal to VdB and Vread. Therefore, the leak current from the drain node of the read cell MC02 via the first adjacent cell MC01 can be prevented, and an increase in the precharge time of the drain node can be suppressed. Moreover, the current inflow from the source node of the first adjacent cell MC01 to the drain node of the read cell MC02 can also be suppressed. As a result, high-speed read can be achieved.

In this case, when the drain of the read cell is located farthest from the block select transistor as shown in FIG. 7, the drain voltage causes a voltage drop. Therefore, when Vsb is made to have a potential equal to Vdb, the source node of the first adjacent cell is disadvantageously precharged higher than the drain node of the read cell. In order to prevent this, Vsb is set to a voltage at which Vdb causes the maximum voltage drop. If the source node of the first adjacent cell is put into the floating state after being precharged with the Vsb under the above setting, then the precharge proceeds further from the bit lines located on both sides up to a potential equal to Vdb and Vread. Therefore, wherever the read cell is located in the memory array, correct read can be achieved.

As is apparent from the above, according to the virtual ground type nonvolatile semiconductor storage device and the data read method of the virtual ground type nonvolatile semiconductor storage device of this invention, the leak current to the adjacent cell can effectively be suppressed, and high-speed read can be achieved.

Moreover, according to the bit line control decoder circuit of this invention, the leak current to the adjacent cell can effectively be suppressed in the virtual ground type nonvolatile semiconductor storage device described above, and therefore, high-speed read can be achieved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A virtual ground type nonvolatile semiconductor storage device, which has a plurality of nonvolatile memory cell transistors arranged in a matrix form, a plurality of word lines for performing row selection and a plurality of bit lines for performing column selection and in which a source region and a drain region of one memory cell transistor are formed in common with a drain region of a memory cell transistor located adjacently on one side in a direction of row and a source region of a memory cell transistor located adjacently on the other side in the direction of row, respectively, and the source and drain regions formed in common, are connected to the bit lines, the virtual ground type nonvolatile semiconductor storage device comprising:
   means for applying a ground potential to the bit line connected to the source region of one memory cell transistor to be subjected to read during read;
   means for applying a read drain bias potential to the bit line connected to the drain region of the one memory cell transistor;
   means for putting the bit line connected to a drain region of a first adjacent memory cell transistor located adjacently on the other side in the direction of row of the one memory cell transistor into a floating state; and
   means for applying a potential equal to the read drain bias potential to the bit line connected to a drain region of a second adjacent memory cell transistor located adjacently on the other side in the direction of row of the first adjacent memory cell transistor.

2. The virtual ground type nonvolatile semiconductor storage device as claimed in claim 1, wherein
   the bit line connected to the drain region of the first adjacent memory cell transistor is put into the floating state after being precharged.

3. The virtual ground type nonvolatile semiconductor storage device as claimed in claim 1, comprising:
   a sense amplifier, which executes sense amplification upon receiving an input corresponding to a potential change of the bit line connected to the drain region of the one memory cell transistor to be subjected to read; and a current-to-voltage converter, which converts a change in a current that flows between the source and the drain of the memory cell transistor into a voltage change and inputs the voltage change into the sense amplifier, while suppressing the potential change of the drain region of the memory cell transistor.

4. The virtual ground type nonvolatile semiconductor storage device as claimed in claim 1, wherein
the plurality of memory cells arranged in a direction of column constitute a block;
a block select transistor is interposedly provided at an end portion of each bit line arranged for each block alternately in the direction of row, and
the block select transistor arranged on one side in the direction of column and the block select transistor arranged on the other side in the direction of column of the block are turned on and off by two control signals, which are mutually different every other line in the direction of row.

5. A dedicated bit line virtual ground type nonvolatile semiconductor storage device, which has a plurality of nonvolatile memory cell transistors arranged in a matrix form, a plurality of word lines for performing row selection and a plurality of bit lines for performing column selection and in which a source region and a drain region of one memory cell transistor are formed in common with a source region of a memory cell transistor located adjacently on one side in a direction of row and a drain region of a memory cell transistor located adjacently on the other side in the direction of row, respectively, and the source region and the drain region formed in common, are connected to the bit lines, the dedicated bit line virtual ground type nonvolatile semiconductor storage device comprising:
means for applying a ground potential to the bit line connected to the source region of one memory cell transistor to be subjected to read during read;
means for applying a read drain bias potential to the bit line connected to the drain region of the one memory cell transistor;
means for putting the bit line connected to a source region of a first adjacent memory cell transistor located adjacently on the other side in the direction of row of the one memory cell transistor into a floating state; and
means for applying a potential equal to the read drain bias potential to the bit line connected to a drain region of a second adjacent memory cell transistor located adjacently on the other side in the direction of row of the first adjacent memory cell transistor.

6. The virtual ground type nonvolatile semiconductor storage device as claimed in claim 5, wherein
the bit line connected to the source region of the first adjacent memory cell transistor is put into the floating state after being precharged.

7. The virtual ground type nonvolatile semiconductor storage device as claimed in claim 5, comprising:
a sense amplifier, which executes sense amplification upon receiving an input corresponding to a potential change of the bit line connected to the drain region of the one memory cell transistor to be subjected to read; and
a current-to-voltage converter, which converts a change in a current that flows between the source and the drain of the memory cell transistor into a voltage change and inputs the voltage change into the sense amplifier, while suppressing the potential change of the drain region of the memory cell transistor.

8. The virtual ground type nonvolatile semiconductor storage device as claimed in claim 5, wherein
the plurality of memory cells arranged in a direction of column constitute a block;
a block select transistor is interposedly provided at an end portion of each bit line arranged for each block alternately in the direction of row, and
the block select transistor arranged on one side in the direction of column and the block select transistor arranged on the other side in the direction of column of the block are turned on and off by two control signals which are mutually different every other line in the direction of row.

9. A bit line control decoder circuit used for a dedicated bit line virtual ground type nonvolatile semiconductor storage device which has a plurality of nonvolatile memory cell transistors arranged in a matrix form, a plurality of word lines for performing row selection and a plurality of bit lines for performing column selection and in which a source region and a drain region of one memory cell transistor are formed in common with a source region of a memory cell transistor located adjacently on one side in a direction of row and a drain region of a memory cell transistor located adjacently on the other side in the direction of row, respectively, and the source region and the drain region formed in common, are respectively connected to the bit lines, the bit line control decoder circuit comprising:
a source bias decoder, which selects a transistor for supplying a source voltage to the bit line connected to the source region of each of the memory cell transistors;
a drain decoder, which selects a drain select transistor (TD0–TD3) by outputting a select signal (D0–D3) to connect the bit line connected to the drain region of each of the memory cell transistors to a sense amplifier; and
a drain bias decoder (DBD), which selects a drain bias select transistor (TC0–TC3) to apply a prescribed voltage to the bit line connected to the drain region of the memory cell transistor, and wherein
the drain bias decoder (DBD) has two groups of drain bias select signal transfer transistors (DD0–DD3, DR0–DR3), which use, every select signal (D0–D3) outputted by the drain decoder, the select signal as a source, and
the drain bias select transistor (TC1), which corresponds to one memory cell transistor, has a gate node connected to the drains of drain bias select signal transfer transistors (DD2, DR0) corresponding to memory cell transistors located next to the one memory cell transistor but one on both sides in the direction of row.

10. A data read method for a virtual ground type nonvolatile semiconductor storage device, which has a plurality of nonvolatile memory cell transistors arranged in a matrix form, a plurality of word lines for performing row selection and a plurality of bit lines for performing column selection and in which a source region and a drain region of one memory cell transistor are formed in common with a drain region of a memory cell transistor located adjacently on one side in a direction of row and a source region of a memory cell transistor located adjacently on the other side in the direction of row, respectively, and the source and drain regions formed in common, are respectively connected to the bit lines, the data read method comprising the steps of:
applying a ground potential and a read drain bias potential to the bit line connected to the source region and the bit line connected to the drain region, respectively, of one memory cell transistor to be subjected to read, while putting the bit line connected to a drain region of a first adjacent memory cell transistor located adjacently on the other side in the direction of row of the one memory cell transistor into a floating state, and while applying a potential equal to the read drain bias potential to the bit line connected to a drain region of a second adjacent memory cell transistor located adjacently on the other side in the direction of row of the first adjacent memory cell transistor, during read.

11. A data read method for a dedicated bit line virtual ground type nonvolatile semiconductor storage device, which has a plurality of nonvolatile memory cell transistors arranged in a matrix form, a plurality of word lines for performing row selection and a plurality of bit lines for performing column selection and in which a source region and a drain region of one memory cell transistor are formed in common with a source region of a memory cell transistor located adjacently on one side in a direction of row and a drain region of a memory cell transistor located adjacently on the other side in the direction of row, respectively, and the source region and the drain region formed in common, are respectively connected to the bit lines, the data read method comprising the steps of:

applying a ground potential and a read drain bias potential to the bit line connected to the source region and the bit line connected to the drain region, respectively, of one memory cell transistor to be subjected to read, while putting the bit line connected to a source region of a first adjacent memory cell transistor located adjacently on the other side in the direction of row of the one memory cell transistor into a floating state, and while applying a potential equal to the read drain bias potential to the bit line connected to a drain region of a second adjacent memory cell transistor located adjacently on the other side in the direction of row of the first adjacent memory cell transistor, during read.

* * * * *